(12) United States Patent
Otsubo et al.

(10) Patent No.: US 11,227,840 B2
(45) Date of Patent: Jan. 18, 2022

(54) ELECTRONIC MODULE HAVING IMPROVED SHIELD PERFORMANCE

(71) Applicant: Murata Manufacturing Co., Ltd., Kyoto (JP)

(72) Inventors: Yoshihito Otsubo, Kyoto (JP); Motohiko Kusunoki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 141 days.

(21) Appl. No.: 16/524,496

(22) Filed: Jul. 29, 2019

(65) Prior Publication Data

US 2020/0043865 A1 Feb. 6, 2020

(30) Foreign Application Priority Data

Aug. 3, 2018 (JP) .............................. JP2018-146859
May 13, 2019 (JP) .............................. JP2019-090887

(51) Int. Cl.
  *H01L 23/552* (2006.01)
  *H01L 23/31* (2006.01)
  (Continued)

(52) U.S. Cl.
  CPC ........ *H01L 23/552* (2013.01); *H01L 23/3121* (2013.01); *H01L 25/165* (2013.01);
  (Continued)

(58) Field of Classification Search
  CPC ................... H01L 23/60; H01L 23/552; H01L 2224/4809; H01L 2224/48097; H01L 2224/48092; H01L 23/3121; H01L 25/165; H01L 23/49822; H03F 2200/222; H03F 2200/294; H03F 2200/114; H03F 3/04
  See application file for complete search history.

(56) References Cited

U.S. PATENT DOCUMENTS

2005/0040501 A1* 2/2005 Hagen ................ H01L 23/3677
                                                         257/660
2007/0241440 A1 10/2007 Hoang et al.
(Continued)

FOREIGN PATENT DOCUMENTS

JP   2000-294979 A   10/2000
JP      5276169 B2    8/2013
(Continued)

OTHER PUBLICATIONS

Office Action for Korean Patent Application No. 10-2019-0091473 dated Oct. 19, 2020.

*Primary Examiner* — Latanya N Crawford Eason
(74) *Attorney, Agent, or Firm* — Pearne & Gordon LLP

(57) ABSTRACT

A module includes a substrate having a main surface, a first component mounted on the main surface, and a first wire group constituted of three or more wires in parallel with each other that are bonded to the main surface so as to straddle the first component while extending in a first direction. When sections are defined along a second direction perpendicular to the first direction, the first wire group includes a first section in which a distance between wires adjacent to each other is a first length and a second section in which a distance between wires adjacent to each other is a second length longer than the first length.

15 Claims, 7 Drawing Sheets

(51) Int. Cl.
*H03F 3/04* (2006.01)
*H01L 25/16* (2006.01)
*H01L 23/498* (2006.01)

(52) U.S. Cl.
CPC .......... *H03F 3/04* (2013.01); *H01L 23/49822* (2013.01); *H03F 2200/114* (2013.01); *H03F 2200/222* (2013.01); *H03F 2200/294* (2013.01)

(56) References Cited

U.S. PATENT DOCUMENTS

| | | |
|---|---|---|
| 2014/0307394 A1 | 10/2014 | Lobianco et al. |
| 2014/0353807 A1 | 12/2014 | Welch et al. |
| 2017/0118841 A1 | 4/2017 | Ino |
| 2017/0263568 A1 | 9/2017 | Jeon et al. |
| 2018/0166363 A1* | 6/2018 | Heppner ............. H01L 25/0655 |

FOREIGN PATENT DOCUMENTS

| | | |
|---|---|---|
| JP | 2017-084898 A | 5/2017 |
| KR | 10-2014-0124339 A | 10/2014 |
| KR | 10-2017-0106548 A | 9/2017 |

\* cited by examiner

ELECTRONIC MODULE HAVING IMPROVED SHIELD PERFORMANCE

This application claims priority from Japanese Patent Application No. 2018-146859 filed on Aug. 3, 2018, and claims priority from Japanese Patent Application No. 2019-090887 filed May 13, 2019. The content of these applications are incorporated herein by reference in their entireties.

BACKGROUND

The present disclosure relates to a module.

In an electronic module in which a die (electronic component) is enclosed in a mold compound (sealing resin), an electronic module having a structure in which a wire bond spring is used as a shield for shielding electromagnetic waves, is described in Japanese Patent No. 5276169.

In the structure described in Japanese Patent No. 5276169, the wire bond spring is only formed on an outer periphery of a resin sealed module, and there is a problem that the shield performance is insufficient.

BRIEF SUMMARY

Accordingly, the present disclosure provides a module having improved shield performance.

A module according to embodiments of the present disclosure includes a substrate having a main surface, a first component mounted on the main surface, and a first wire group constituted of three or more wires in parallel with each other that are bonded to the main surface so as to straddle the first component while extending in a first direction. When sections are defined along a second direction perpendicular to the first direction, the first wire group includes a first section in which a distance between wires adjacent to each other is a first length, and a second section in which a distance between wires adjacent to each other is a second length longer than the first length.

According to the present disclosure, there is provided the first wire group constituted of three or more wires in parallel with each other, and since the distance between the wires particularly in the first section in the first wire group is short, it is possible to selectively perform shield in this section. Therefore, a module having improved shield performance can be realized.

Other features, elements, characteristics and advantages of the present disclosure will become more apparent from the following detailed description of embodiments of the present disclosure with reference to the attached drawings.

DETAILED DESCRIPTION

Figure 1:
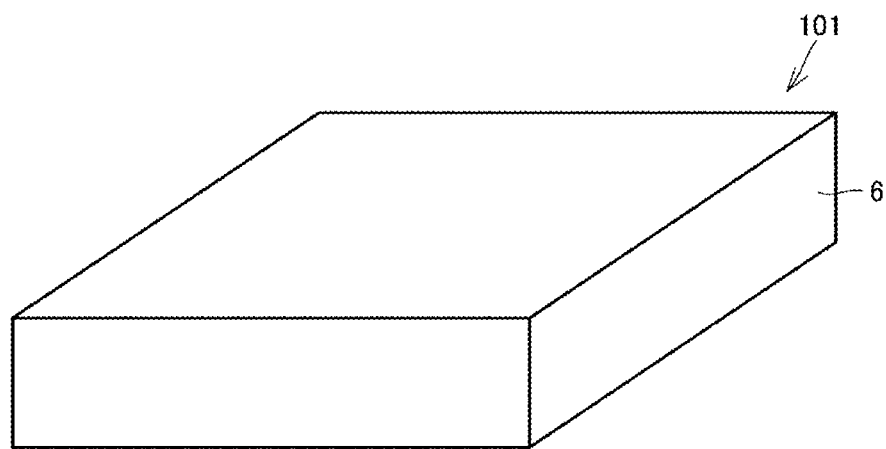
FIG. 1 is a first perspective view of a module according to a first embodiment of the present disclosure.

The dimension ratio shown in the drawings does not always exactly represent a real ratio, and the dimension ratio may be exaggerated for convenience of explanation in some cases. In the description that follows, reference to the concept of upper or lower may not necessarily mean absolute upper or lower, but may mean relative upper or lower in an illustrated posture in some cases.

First Embodiment

Configuration

A module according to a first embodiment of the present disclosure will be described below with reference to FIG. 1 to FIG. 5. The module described herein may be a module with built-in components or a module with mounted components.

Figure 2:
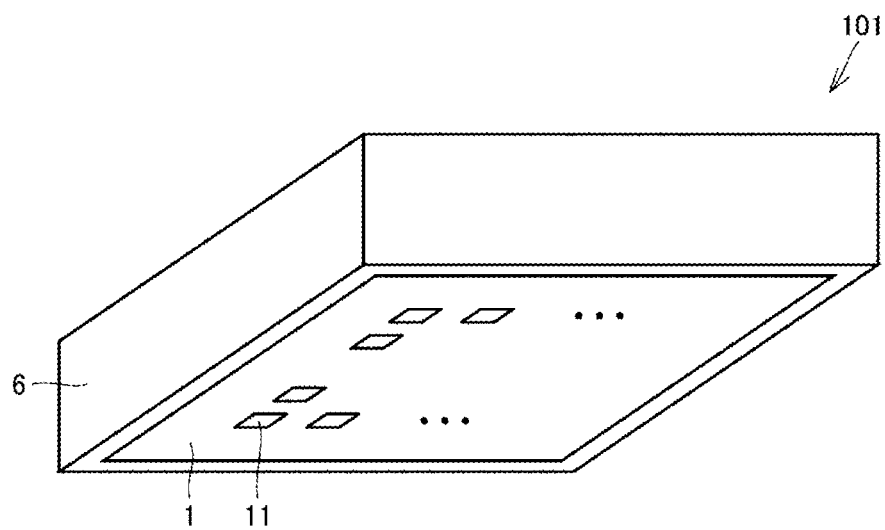
FIG. 2 is a second perspective view of the module according to the first embodiment of the present disclosure.
Figure 3:
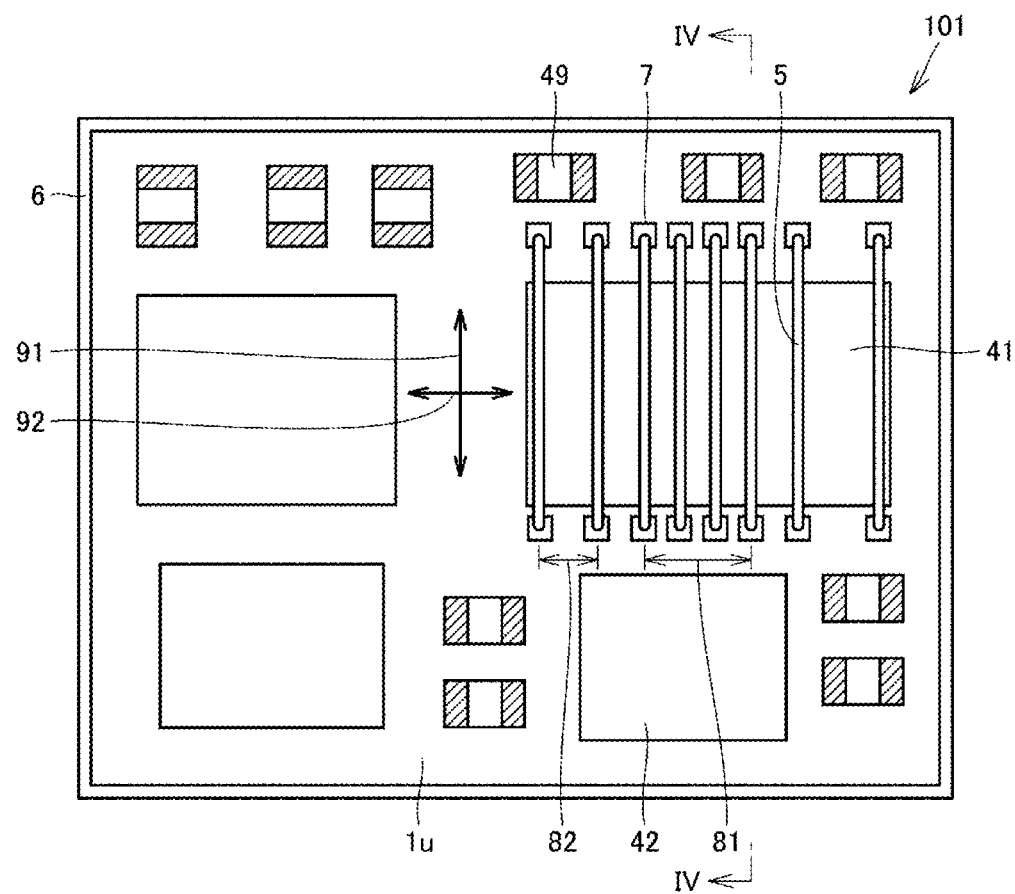
FIG. 3 is a perspective plan view of the module according to the first embodiment of the present disclosure.
Figure 4:
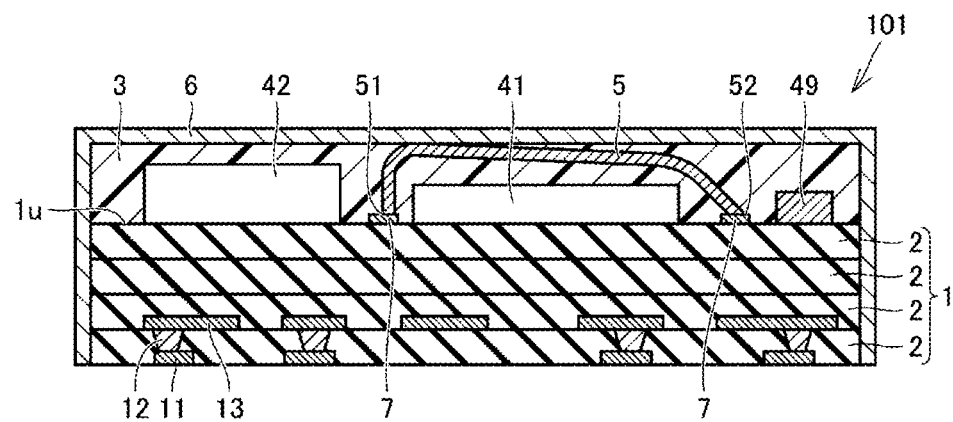
FIG. 4 is a sectional view taken along a line IV-IV in FIG. 3.
Figure 5:
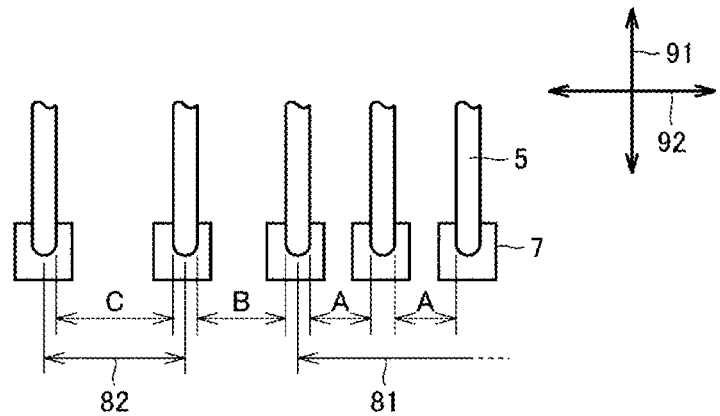
FIG. 5 is a partially enlarged view of FIG. 4.

FIG. 1 illustrates an appearance of a module 101 according to the present embodiment. An upper surface and a side surface of the module 101 are covered with a shield film 6. FIG. 2 illustrates the module 101 when viewed from an angle at a lower side in FIG. 1. A lower surface of the module 101 is not covered with the shield film 6, and a substrate 1 is exposed. One or more external connection electrodes 11 are provided on a lower surface of the substrate 1. The number, the size and the arrangement of the external connection electrodes 11 illustrated in FIG. 2 are merely examples. The substrate 1 may be provided with a wiring on a surface or inside thereof. The substrate 1 may be a resin substrate or a ceramic substrate. The substrate 1 may be a multilayer substrate. A perspective plan view of the module 101 is illustrated in FIG. 3. FIG. 3 corresponds to a case of viewing from the top a state in which an upper surface of the shield film 6 of the module 101 is removed and a sealing resin 3 is removed. A first component 41 is mounted on a main surface 1$u$ of the substrate 1. The first component 41 may be, for example, an integrated circuit (IC). More specifically, the first component 41 may be, for example, a low noise amplifier (LNA). A plurality of pad electrodes 7 is arranged on the main surface 1$u$. A sectional view taken along a line IV-IV in FIG. 3 is illustrated in FIG. 4. A partially enlarged view of FIG. 4 is illustrated in FIG. 5. In FIG. 5, a section in which a distance between wires 5 adjacent to each other is A, a section in which a distance between the wires 5 adjacent to each other is B, and a section in which a distance between the wires 5 adjacent to each other is C are illustrated.

The module 101 in this embodiment includes the substrate 1 having the main surface 1$u$, the first component 41 mounted on the main surface 1$u$, and a first wire group constituted of three or more wires 5 in parallel with each other that are bonded to the main surface 1$u$ so as to straddle the first component 41 while extending in a first direction 91. When the sections are defined along a second direction 92 perpendicular to the first direction 91, the first wire group includes a first section 81 in which a distance between wires adjacent to each other is a first length A, and a second section 82 in which a distance between wires 5 adjacent to each other is a second length C longer than the first length A.

As illustrated in FIG. 4, the wire 5 has a first end 51 and a second end 52. The first end 51 and the second end 52 are connected to any one of the pad electrodes 7, respectively. Here, "the first end" is a start point of bonding, and "the second end" is an end point of bonding. Thus, since the first end is the start point of bonding, when the first end is connected to the pad electrode 7, the wire 5 can be pulled up perpendicularly to the main surface $1u$. Therefore, at this point, there is almost no risk of contact between the wires 5 and the first component 41. Accordingly, with respect to the first end, the wire 5 and the first component 41 can be arranged in close proximity to each other. On the other hand, since the second end is the end point of bonding and it is difficult to perpendicularly form the wire 5 toward the main surface $1u$, it is necessary to separate the wire 5 from the first component 41 as compared with the first end side. In FIG. 4, the first end 51 is located close to the first component 41, whereas the second end 52 is away from the first component 41 due to such reasons. In this embodiment, a portion where the necessity of shield is higher is used as the first end of bonding.

As illustrated in FIG. 4, a conductor via 12 is electrically connected to the external connection electrode 11 provided on the lower surface of the substrate 1. Inside the substrate 1, an internal conductor pattern 13 is arranged. The conductor via 12 electrically connects the external connection electrode 11 and the internal conductor pattern 13 to each other so as to penetrate through an insulating layer 2. The positions, sizes and arrangements of the external connection electrode 11, the conductor via 12 and the internal conductor pattern 13 illustrated here are merely illustrated by way of example, and are not limited thereto.

In the example illustrated in FIG. 3 and FIG. 4, in addition to the first component 41, a second component 42 and a chip component 49 are mounted on the main surface $1u$. The second component 42 may, for example, be an IC. Here, the chip component 49 is a capacitor, but the type of chip component is not limited to this. The chip component may be, for example, an inductor or a resistor. The positions, sizes and arrangements of the various components mounted on the main surface $1u$ are merely shown by way of example, and are not limited thereto.

Operation/Effects

In this embodiment, since there is provided the first wire group constituted of three or more wires 5 in parallel with each other that are bonded to the main surface $1u$ so as to straddle the first component 41, the first component 41 can be shielded by these wires 5. The first wire group includes the first section 81 and the second section 82, and since the distance between the wires 5 is short in the first section 81, the section can be selectively and particularly shielded. Therefore, a module having improved shield performance can be realized.

As described in this embodiment, the module 101 can include the second component mounted on the main surface $1u$, and that a row in which one ends of the wires 5 in the first section 81 are lined up can be positioned between the first component 41 and the second component 42. Further, one ends of the wires 5 provided between the first component 41 and the second component 42 can serve as the start point for bonding.

By adopting this configuration, one ends of the wires 5 are densely arrayed between the first component 41 and the second component 42, so that it is possible to selectively shield a portion between the first component 41 and the second component 42, and it is possible to reduce electromagnetic effects that may possibly occur between the first component 41 and the second component 42. In this embodiment, the first end serving as the start point of bonding is arranged between the first component 41 and the second component 42. In other words, a portion where the necessity of shield is higher is used as the first end of bonding. In this way, it is possible to suppress manufacturing variations in bonding at a portion where shield is required, and a stable shield effect can be obtained.

As described in this embodiment, the shield film 6 spaced apart from the main surface $1u$ can be included and arranged so as to cover the first component 41 and the first wire group. FIG. 4 illustrates a state in which the shield film 6 is spaced apart from the main surface $1u$. By adopting this configuration, a shield effect by the shield film 6 can also be obtained. As illustrated in FIG. 4, a space inside the shield film 6 can be filled with the sealing resin 3. In other words, the module 101 can include the sealing resin 3 arranged so as to cover the first component 41 and the three or more wires 5. As described in this embodiment, when the module 101 also includes the second component 42, the module 101 can include the sealing resin 3 arranged so as to cover the first component 41, the second component 42, and the three or more wires 5.

As illustrated in FIG. 4, at least any wire 5 in the first wire group can be in contact with the shield film 6. By adopting this configuration, the shield film 6 is connected to a ground of the substrate by the wire 5, so that the space surrounded by the shield film 6 can be efficiently shielded.

In a case where the first component 41 is the LNA, the receiving sensitivity can be improved. When the first component 41 is the LNA, an inductor for input matching of the LNA may be arranged in addition to the LNA as the first component 41, but the inductor can be shielded for input matching of the LNA in the same manner.

Second Embodiment

Configuration

Figure 6:
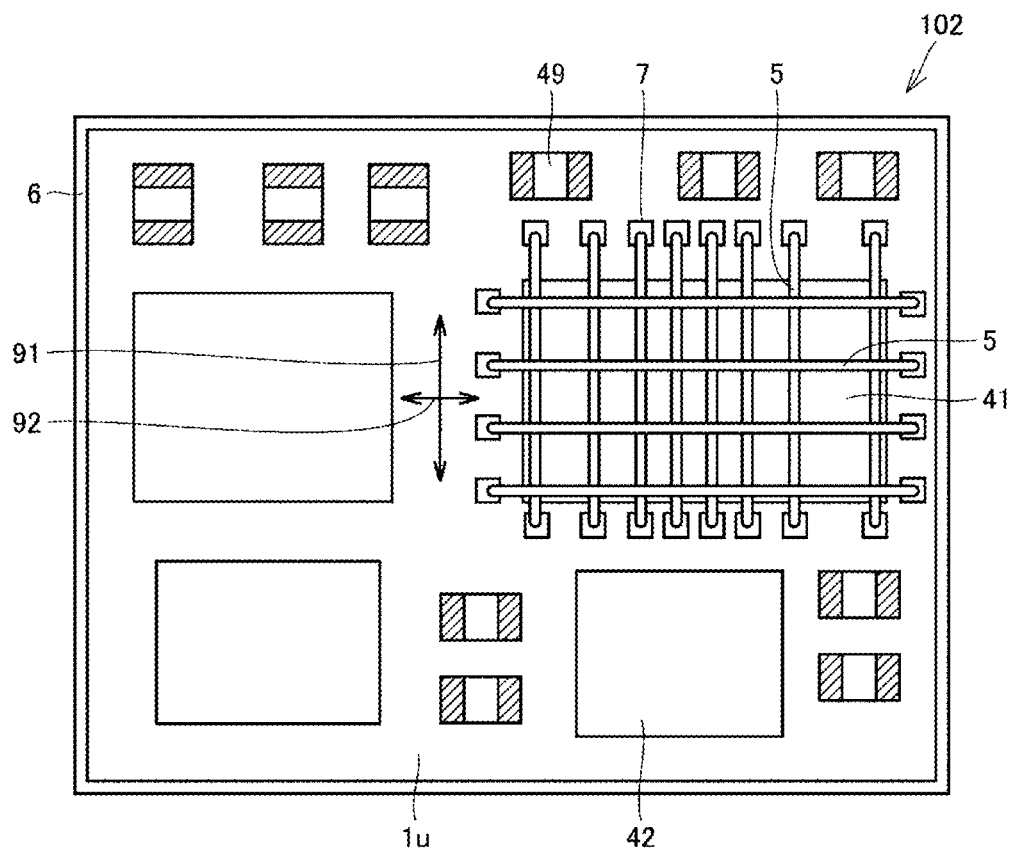
FIG. 6 is a perspective plan view of a module according to a second embodiment of the present disclosure.

A module according to a second embodiment of the present disclosure will be described with reference to FIG. 6. FIG. 6 illustrates a module 102 according to the present embodiment in perspective plan view. The module 102 in this embodiment has the same basic configuration as that of the module 101 described in the first embodiment, but is different in the following points.

The module 102 includes a second wire group arranged in a direction different from the first wire group and constituted of three or more wires 5 in parallel with each other that are bonded to the main surface $1u$ so as to straddle the first component 41. In FIG. 6, a set of wires 5 strung in a vertical direction is the first wire group, and a set of wires 5 strung in a lateral direction is the second wire group. That is, three or more wires 5 are arranged over the entire circumference of the first component 41 so as to straddle the first component 41. The wires 5 belonging to the second wire group are arranged at equal intervals.

Operation/Effects

In this embodiment, since the second wire group is provided in addition to the first wire group, it is possible to shield the first component 41 more reliably.

Third Embodiment

Configuration

Figure 7:
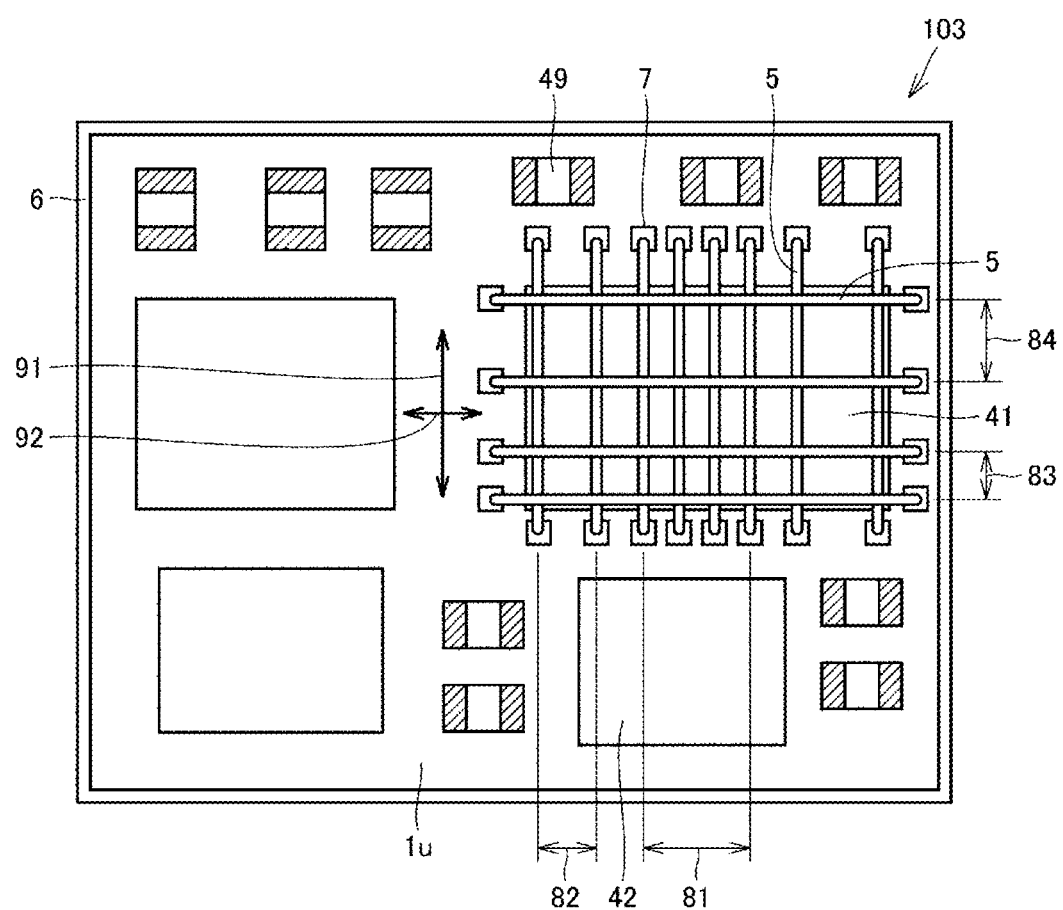
FIG. 7 is a perspective plan view of a module according to a third embodiment of the present disclosure.

A module according to a third embodiment of the present disclosure will be described with reference to FIG. 7. FIG. 7 illustrates a module 103 according to the present embodiment in perspective plan view. The module 103 in this embodiment has the same basic configuration as that of the module 102 described in the second embodiment, but is different in the following points.

In the module 103, when the sections are defined along the first direction 91, the second wire group includes a third section 83 in which a distance between wires 5 adjacent to each other is a third length, and a fourth section 84 in which a distance between wires 5 adjacent to each other is a fourth length longer than the third length.

Operation/Effects

Also in this embodiment, the same effects as those in the third embodiment can be obtained. Since the wires 5 belonging to the second wire group are densely arranged in the third section 83, it is possible to selectively shield the desired area of the first component 41.

As described in the second and third embodiments, the first wire group and the second wire group may be orthogonal to each other. By adopting this configuration, a large number of wires 5 can be efficiently arranged.

Fourth Embodiment

Configuration

Figure 8:
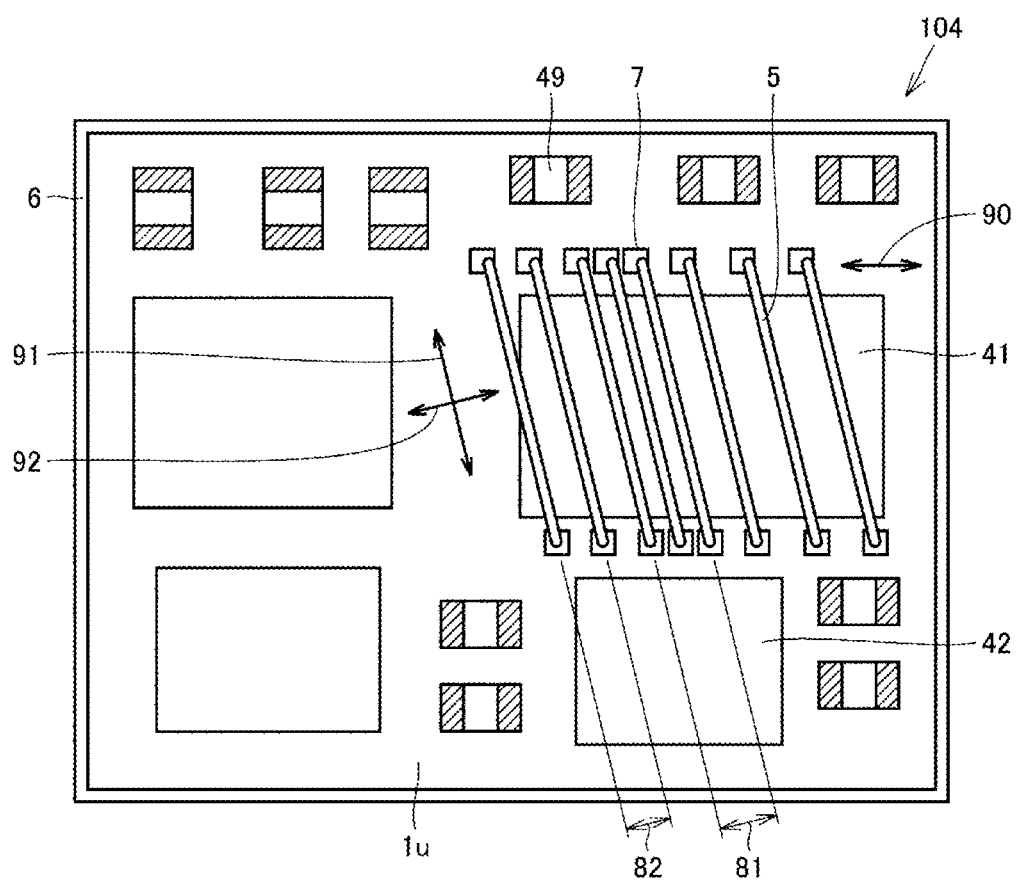
FIG. 8 is a perspective plan view of a module according to a fourth embodiment of the present disclosure.

A module according to a fourth embodiment of the present disclosure will be described with reference to FIG. 8. FIG. 8 illustrates a module 104 according to the present embodiment in perspective plan view.

In the module 104, the first direction 91 intersects obliquely with a longitudinal direction 90 of the first component 41. The wire 5 extends along the first direction 91.

Operation/Effects

In this embodiment, since the wires 5 are arranged obliquely with respect to the longitudinal direction of the first component 41, the degree of freedom in design is increased, and the wires 5 can be efficiently arranged in a limited space.

Figure 9:
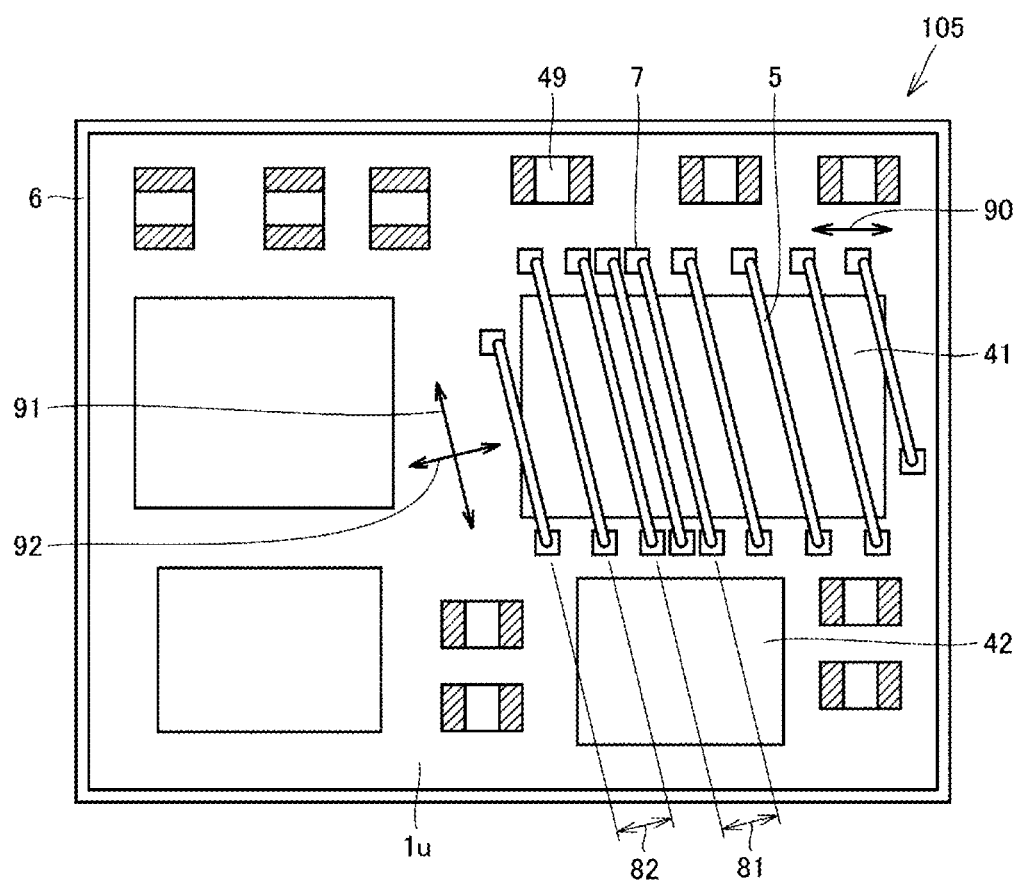
FIG. 9 is a perspective plan view of a variation on the module according to the fourth embodiment of the present disclosure.

As a variation on the present embodiment, a module such as a module 105 illustrated in FIG. 9 may also be conceivable. In the module 105, not only the first direction 91 for determining the direction of the wire 5 obliquely intersects with the longitudinal direction 90 of the first component 41, but also the length of the wire 5 is not constant. The wires 5 having different lengths are arranged in combination. In this way, when the wires 5 having different lengths are combined in accordance with a situation, the degree of freedom in design can be further increased, and the wires 5 can be efficiently arranged in a limited space. That is, three or more wires 5 are arranged over the entire circumference of the first component 41 so as to straddle the first component 41. Therefore, the shield effect of the first component 41 can be more effectively obtained.

Fifth Embodiment

Configuration

Figure 10:
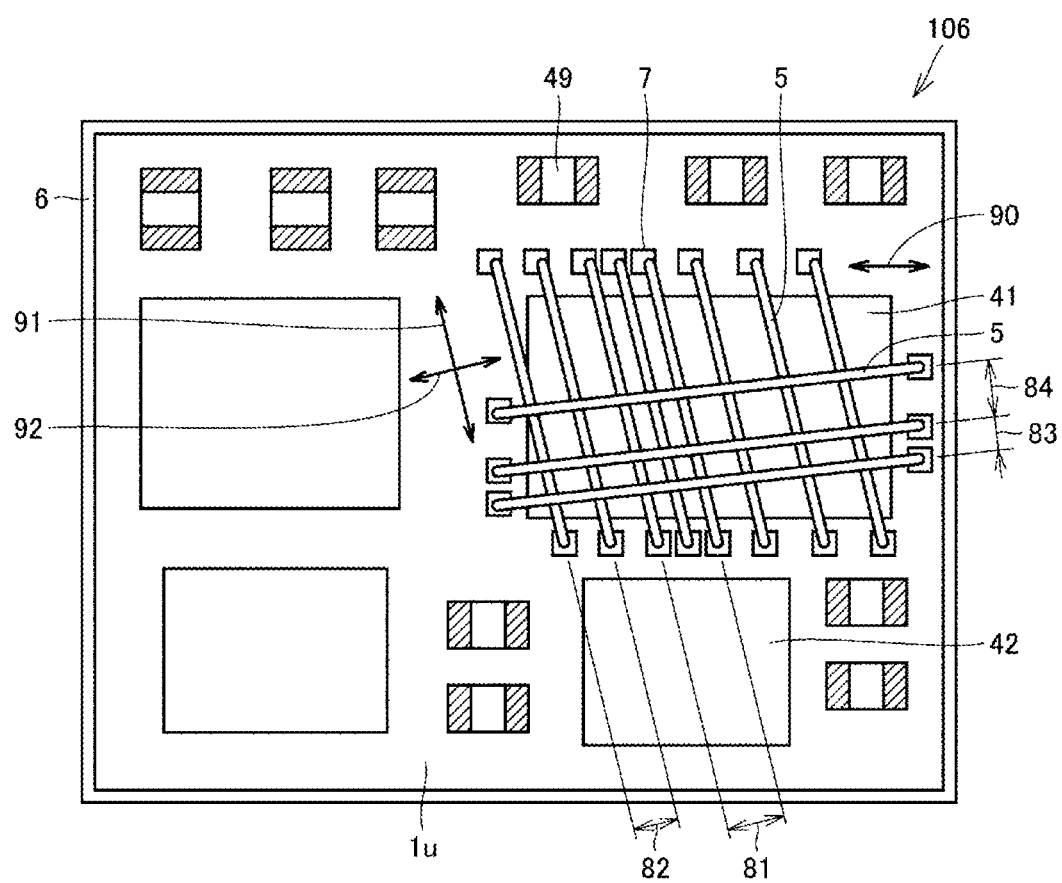
FIG. 10 is a perspective plan view of a module according to a fifth embodiment of the present disclosure.

A module according to a fifth embodiment of the present disclosure will be described with reference to FIG. 10. FIG. 10 illustrates a module 106 according to the present embodiment in perspective plan view. The module 106 in this embodiment has the same basic configuration as that of the module 103 described in the third embodiment, but is different in the following points.

In the module 106, the first direction 91 intersects obliquely with the longitudinal direction 90 of the first component 41. The wires 5 of the first wire group extend along the first direction 91. The wires 5 of the second wire group are not necessarily parallel to the second direction 92. In the example illustrated in FIG. 10, the wires 5 of the second wire group are not parallel to the second direction 92.

Operation/Effects

In this embodiment, since the first wire group and the second wire group are arranged and the extending directions thereof are different from the longitudinal direction 90 of the first component 41, the degree of freedom in design is high, and the wires 5 can be efficiently arranged in a limited space.

As described in the second, third and fifth embodiments, the shield film 6 spaced apart from the main surface $1u$ can be included and arranged so as to cover the first component 41, the first wire group and the second wire group. At least any wire of the first wire group and the second wire group can be in contact with the shield film 6. By adopting this configuration, the shield film 6 is connected to a ground of the substrate by the wire 5, so that the wire 5 and the shield film 6 can be made at the same potential and the space surrounded by the shield film 6 can be efficiently shielded.

In the above embodiments, the components are substantially rectangular as an example, but the shapes of the components are not limited to a rectangle, and other shapes may also be used.

In addition, two or more of the above embodiments may be combined as appropriate. It should be noted that the above described embodiments are illustrative in all respects and are not restrictive. The scope of the disclosure is indicated by the appended claims and is intended to cover all modifications within the meaning and range equivalent to the scope of the appended claims.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A module comprising:
   a substrate having a main surface;
   a first component mounted on the main surface; and
   a first wire group constituted of three or more wires disposed in parallel with each other that are bonded to the main surface so as to straddle the first component while extending in a first direction, wherein the first direction obliquely intersects with a longitudinal direction of the first component,
   wherein when sections are defined along a second direction perpendicular to the first direction, the first wire group includes a first section in which a distance between wires adjacent to each other is a first length and a second section in which a distance between wires adjacent to each other is a second length longer than the first length, such that in a region where the first component is straddled in plan view, distances between adjacent wires vary.

2. The module according to claim 1, including a second component mounted on the main surface,
   wherein a row in which one ends of the wires in the first section are lined up is located between the first component and the second component.

3. The module according to claim 1, including a second wire group arranged in a direction different from the first wire group and constituted of three or more wires disposed in parallel with each other that are bonded to the main surface so as to straddle the first component.

4. The module according to claim 3,
wherein when sections are defined along the first direction, the second wire group includes a third section in which a distance between wires adjacent to each other is a third length and a fourth section in which a distance between wires adjacent to each other is a fourth length longer than the third length.

5. The module according to claim 3,
wherein the three or more wires of the first wire group and the three or more wires of the second wire group are orthogonal to each other.

6. The module according to claim 1, including a sealing resin configured to cover the first component and the three or more wires.

7. The module according to claim 1, including a shield film spaced apart from the main surface and configured to cover the first component and the first wire group.

8. The module according to claim 7,
wherein at least any wire of the first wire group is in contact with the shield film.

9. The module according to claim 3, including a shield film spaced apart from the main surface and configured to cover the first component, the first wire group and the second wire group.

10. The module according to claim 9,
wherein at least any wire of the first wire group and the second wire group is in contact with the shield film.

11. The module according to claim 2, including a sealing resin configured to cover the first component, the second component and the three or more wires.

12. The module according to claim 1,
wherein the first component is a low noise amplifier.

13. The module according to claim 2, including a second wire group arranged in a direction different from the first wire group and constituted of three or more wires disposed in parallel with each other that are bonded to the main surface so as to straddle the first component.

14. The module according to claim 4,
wherein the three or more wires of the first wire group and the three or more wires of the second wire group are orthogonal to each other.

15. A module comprising:
a substrate having a main surface;
a first component mounted on the main surface; and
a first wire group constituted of three or more wires disposed in parallel with each other that are bonded to the main surface such that each wire of the first wire group extends over and straddles the first component while extending in a first direction, wherein the first direction obliquely intersects with a longitudinal direction of the first component,
wherein when sections are defined along a second direction perpendicular to the first direction, the first wire group includes a first section in which a distance between wires adjacent to each other is a first length and a second section in which a distance between wires adjacent to each other is a second length longer than the first length.

* * * * *